(12) United States Patent
Takayama

(10) Patent No.: US 12,471,450 B2
(45) Date of Patent: Nov. 11, 2025

(54) DISPLAY DEVICE AND MANUFACTURING METHOD OF DISPLAY DEVICE

(71) Applicant: Magnolia White Corporation, Tokyo (JP)

(72) Inventor: Masaru Takayama, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 0 days.

(21) Appl. No.: 18/420,770

(22) Filed: Jan. 24, 2024

(65) Prior Publication Data

US 2024/0244888 A1  Jul. 18, 2024

Related U.S. Application Data

(63) Continuation of application No. 18/450,412, filed on Aug. 16, 2023, now Pat. No. 11,937,463, which is a (Continued)

(30) Foreign Application Priority Data

Mar. 10, 2022  (JP) ................. 2022-037169

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/80521* (2023.02); *H10K 59/873* (2023.02)

(58) Field of Classification Search
CPC ............. H10K 59/122; H10K 59/1201; H10K 59/80521; H10K 59/873
(Continued)

(56) References Cited

U.S. PATENT DOCUMENTS

2004/0207316 A1* 10/2004 Birnstock ............ H10K 59/173
313/506
2009/0009069 A1   1/2009 Takata
(Continued)

FOREIGN PATENT DOCUMENTS

DE  112019001693 T5  12/2020
WO     2022039890 A1   2/2022

OTHER PUBLICATIONS

English Machine Translation of JP 2008-135325 (Year: 2008).*
German Office Action issued Feb. 20, 2025, in DE Application No. 10 2023 201 401.7, 12pp.

*Primary Examiner* — Dzung Tran
(74) *Attorney, Agent, or Firm* — XSENSUS LLP

(57) ABSTRACT

According to one embodiment, a display device includes a substrate, a lower electrode, a rib, a partition including a lower portion and an upper portion, an organic layer provided on the lower electrode and including a light emitting layer, and an upper electrode provided on the organic layer and in contact with the lower portion of the partition. The organic layer includes a first end portion located on the rib, and a second end portion located on the rib on an opposite side of the first end portion. A thickness of the upper electrode immediately above the second end portion is greater than a thickness of the upper electrode immediately above the first end portion.

8 Claims, 18 Drawing Sheets

Related U.S. Application Data continuation of application No. 18/168,584, filed on Feb. 14, 2023.

(58) Field of Classification Search
USPC .......................................................... 257/40
See application file for complete search history.

(56) References Cited

U.S. PATENT DOCUMENTS

| | | |
|---|---|---|
| 2012/0217516 A1 | 8/2012 | Hatano et al. |
| 2015/0060806 A1* | 3/2015 | Park .................... H10K 50/8428 257/40 |
| 2015/0380685 A1* | 12/2015 | Lee ...................... H10K 59/122 257/40 |
| 2016/0190508 A1* | 6/2016 | Nakamura ........... H10K 50/844 257/40 |
| 2018/0366524 A1* | 12/2018 | Bang .................... H10K 50/822 |
| 2020/0212116 A1* | 7/2020 | Kim .................... G06F 3/04166 |
| 2022/0223669 A1* | 7/2022 | Takayama ........ H10K 59/80522 |

* cited by examiner

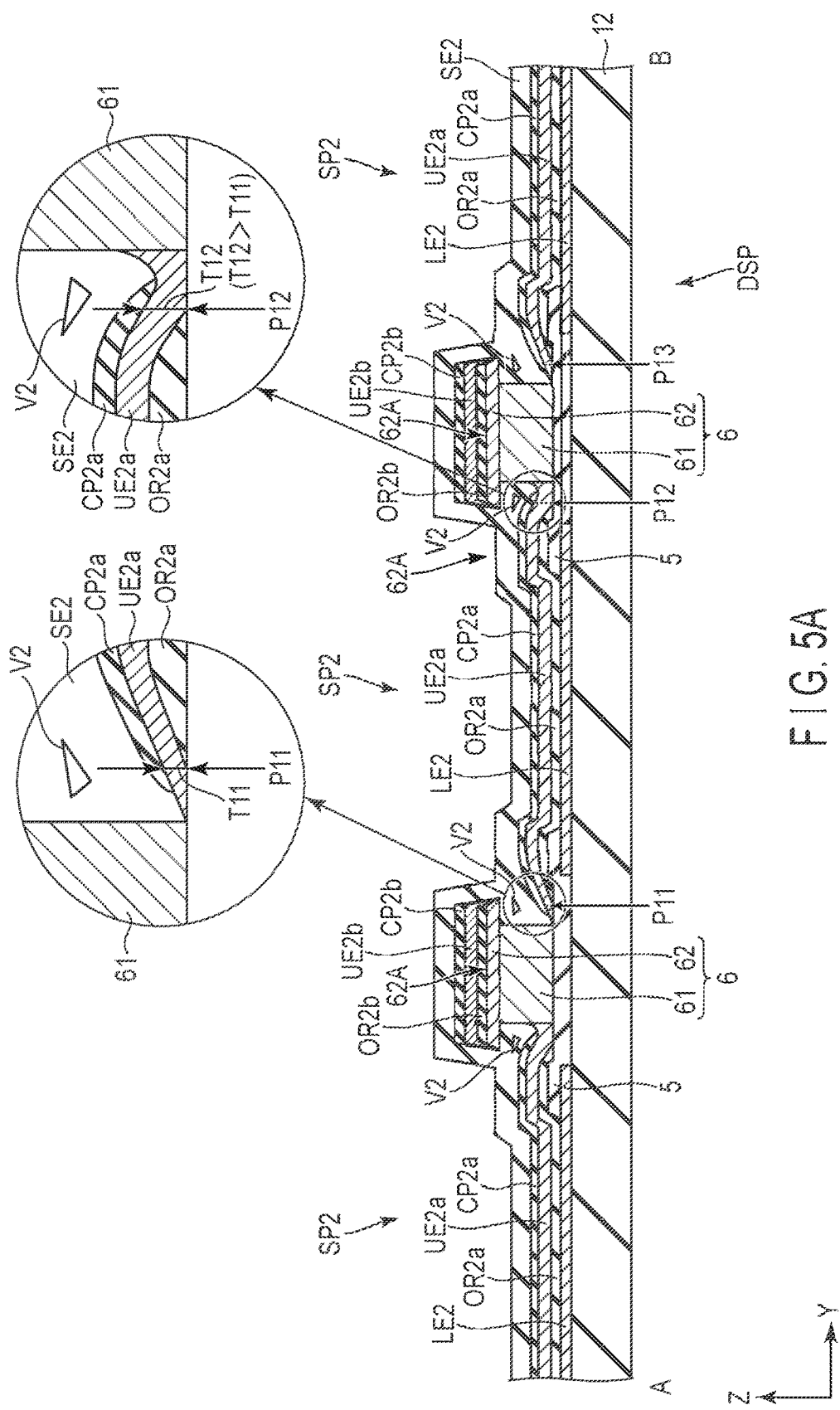
F I G. 5A

DISPLAY DEVICE AND MANUFACTURING METHOD OF DISPLAY DEVICE

CROSS-REFERENCE TO RELATED APPLICATIONS

This application is a continuation of U.S. application Ser. No. 18/450,412, filed Aug. 16, 2023, which is a continuation of U.S. application Ser. No. 18/168,584, filed Feb. 14, 2023, which is based upon and claims the benefit of priority from Japanese Patent Application No. 2022-037169, filed Mar. 10, 2022, the entire contents of each are incorporated herein by reference.

FIELD

Embodiments described herein relate generally to a display device and a manufacturing method of the display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole-transport layer and an electron-transport layer in addition to a light emitting layer.

In the process of manufacturing such a display element, a technique which prevents the reduction in reliability has been required.

BRIEF DESCRIPTION OF THE DRAWINGS

FIGS. 5A and 5B are schematic cross-sectional views of the display device DSP along the A-B line of FIG. 2.

DETAILED DESCRIPTION

Figure 1:
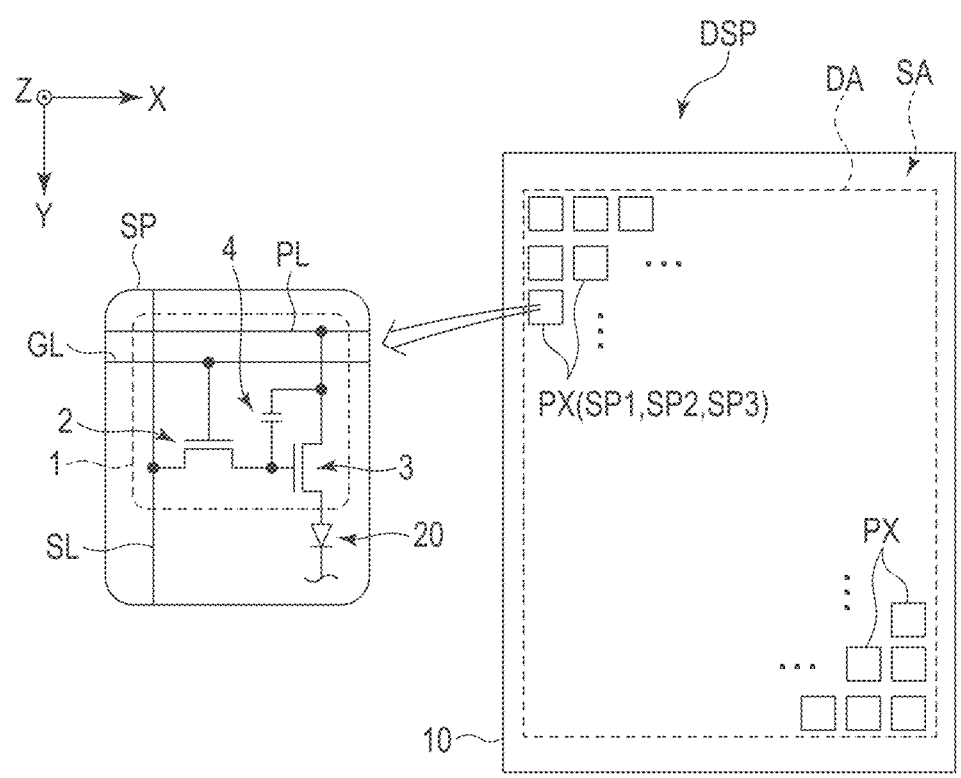
FIG. 1 is a diagram showing a configuration example of a display device DSP.

Embodiments described herein aim to provide a display device which can prevent the reduction in reliability and a manufacturing method of such a display device.

In general, according to one embodiment, a display device comprises a substrate, a lower electrode provided above the substrate, a rib comprising an aperture overlapping the lower electrode, a partition comprising a lower portion provided on the rib, and an upper portion provided on the lower portion and protruding from a side surface of the lower portion, an organic layer provided on the lower electrode in the aperture and including a light emitting layer, and an upper electrode which is provided on the organic layer and is in contact with the lower portion of the partition. The organic layer comprises a first end portion located on the rib, and a second end portion located on the rib on an opposite side of the first end portion. A thickness of the upper electrode immediately above the second end portion is greater than a thickness of the upper electrode immediately above the first end portion.

According to another embodiment, a manufacturing method of a display device comprises preparing a processing substrate by forming, above a substrate, a first lower electrode and a second lower electrode, a rib comprising a first aperture overlapping the first lower electrode and a second aperture overlapping the second lower electrode, and a partition including a lower portion provided on the rib between the first aperture and the second aperture and an upper portion provided on the lower portion and protruding from a side surface of the lower portion, forming a first organic layer including a first light emitting layer on the first lower electrode in the first aperture, forming a first upper electrode on the first organic layer, forming a second organic layer on the second lower electrode in the second aperture, the second organic layer including a second light emitting layer different from the first light emitting layer, and forming a second upper electrode on the second organic layer. In an evaporation device which forms the first upper electrode and the second upper electrode, an extension direction of an evaporation source inclines with respect to a normal of the substrate, and a conductive material is deposited on the processing substrate while the processing substrate is conveyed in one direction. An evaporation direction for forming the first upper electrode is different from an evaporation direction for forming the second upper electrode.

The embodiments can provide a display device which can prevent the reduction in reliability and a manufacturing method of such a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various types of elements are viewed parallel to the third direction Z.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 maybe glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1, a blue subpixel SP2 and a green subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element. For example, subpixel SP1 comprises a display element 20 which emits light in a red wavelength range. Subpixel SP2 comprises a display element 20 which emits light in a blue wavelength range. Subpixel SP3 comprises a display element 20 which emits light in a green wavelength range.

Figure 2:
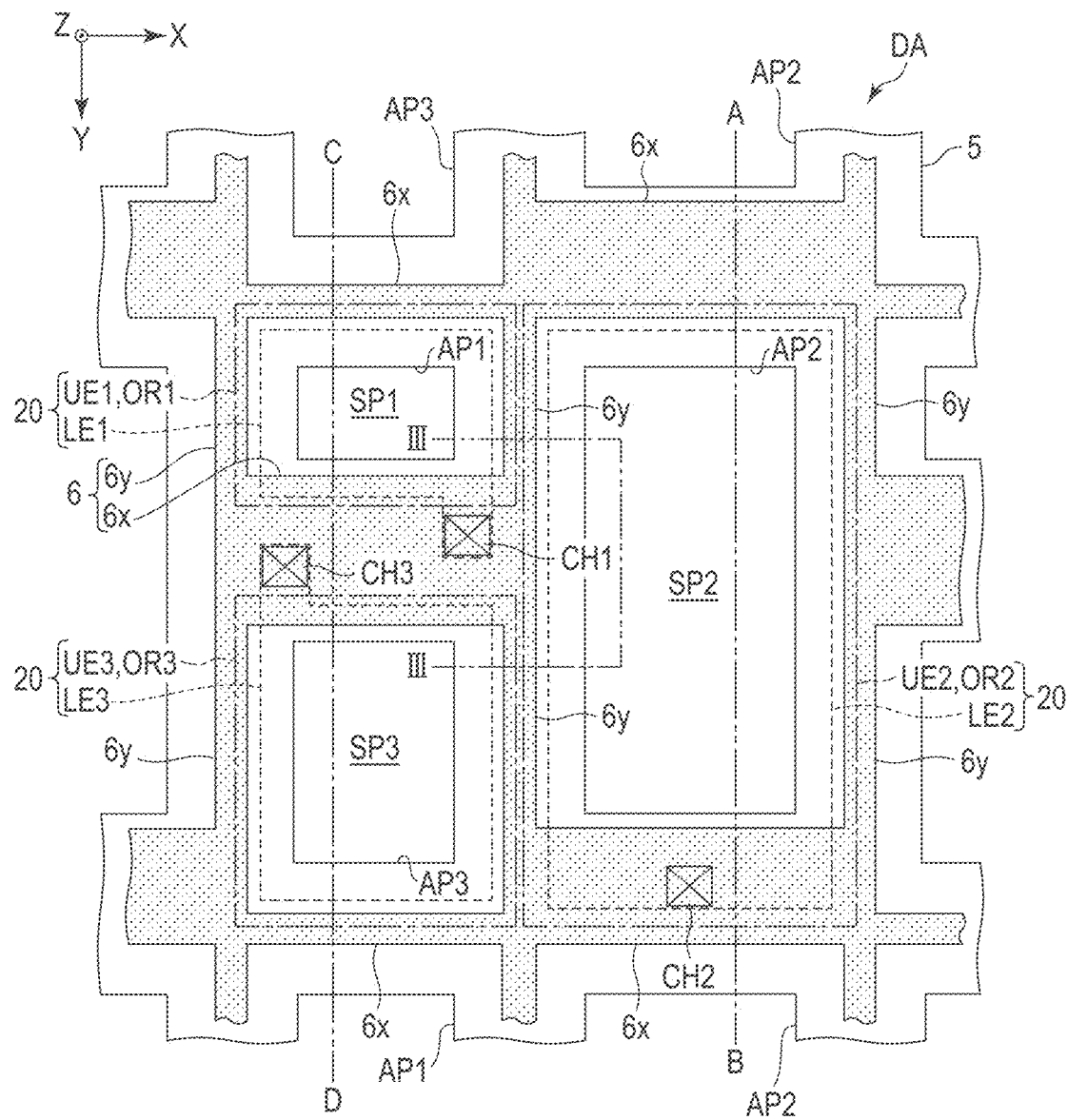
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP1 and SP3 are arranged in the second direction Y. Further, each of subpixels SP1 and SP3 is adjacent to subpixel SP2 in the first direction X.

When subpixels SP1, SP2 and SP3 are provided in line with this layout, in the display area DA, a column in which subpixels SP1 and SP3 are alternately provided in the second direction Y and a column in which a plurality of subpixels SP2 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. In the example of FIG. 2, the aperture AP3 is larger than the aperture AP1, and the aperture AP2 is larger than the aperture AP3.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP1 and AP3 which are adjacent to each other in the second direction Y and between two apertures AP2 which are adjacent to each other in the second direction Y. Each second partition 6y is provided between the apertures AP1 and AP2 which are adjacent to each other in the first direction X and between the apertures AP2 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. The outer shape of the upper electrode UE1 is substantially coincident with the outer shape of the organic layer OR1. The peripheral portion of each of the upper electrode UE1 and the organic layer OR1 overlaps the partition 6. The outer shape of the upper electrode UE2 is substantially coincident with the outer shape of the organic layer OR2. The peripheral portion of each of the upper electrode UE2 and the organic layer OR2 overlaps the partition 6. The outer shape of the upper electrode UE3 is substantially coincident with the outer shape of the organic layer OR3. The peripheral portion of each of the upper electrode UE3 and the organic layer OR3 overlaps the partition 6.

The lower electrode LE1, the upper electrode UE1 and the organic layer OR1 constitute the display element 20 of subpixel SP1. The lower electrode LE2, the upper electrode UE2 and the organic layer OR2 constitute the display element 20 of subpixel SP2. The lower electrode LE3, the upper electrode UE3 and the organic layer OR3 constitute the display element 20 of subpixel SP3. The lower electrodes LE1, LE2 and LE3 correspond to, for example, the anodes of the display elements 20. The upper electrodes UE1, UE2 and UE3 correspond to the cathodes of the display elements 20 or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

Figure 3:
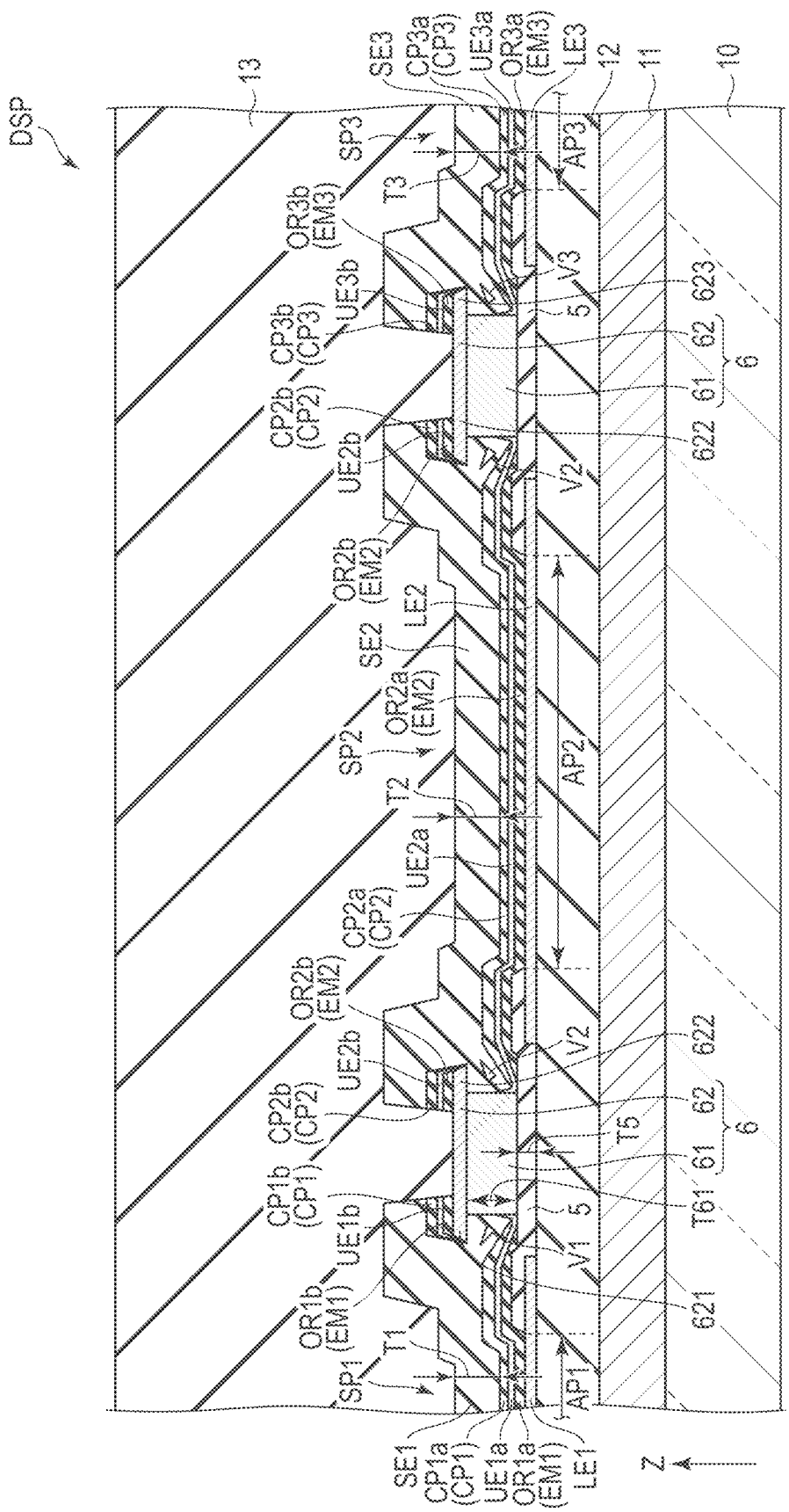
FIG. 3 is a schematic cross-sectional view of the display device DSP along the III-III line of FIG. 2.

FIG. 3 is a schematic cross-sectional view of the display device DSP along the III-III line of FIG. 2.

A circuit layer 11 is provided on the substrate 10 described above. The circuit layer 11 includes various circuits such as the pixel circuit 1, and various lines such as the scanning line GL, the signal line SL and the power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, in FIG. 3, the both end portions of the upper portion 62 protrude relative to the side surfaces of the lower portion 61. This shape of the partition 6 maybe called an overhang shape. Of the upper portion 62, a portion which protrudes relative to the lower portion 61 maybe simply called a protrusion.

The organic layer OR1 shown in FIG. 2 includes first and second portions OR1a and OR1b spaced apart from each other as shown in FIG. 3. The first portion OR1a is in contact with the lower electrode LE1 through the aperture AP1, covers the lower electrode LE1 and overlaps part of the rib 5. The second portion OR1b is provided on the upper portion 62.

The upper electrode UE1 shown in FIG. 2 includes first and second portions UE1a and UE1b spaced apart from each other as shown in FIG. 3. The first portion UE1a faces the lower electrode LE1 and is provided on the first portion OR1a. Further, the first portion UE1a is in contact with a side surface of the lower portion 61. The second portion UE1b is located above the partition 6 and is provided on the second portion OR1b.

The first portion OR1a and the first portion UE1a are located on the lower side relative to the upper portion 62.

The organic layer OR2 shown in FIG. 2 includes first and second portions OR2a and OR2b spaced apart from each other as shown in FIG. 3. The first portion OR2a is in contact with the lower electrode LE2 through the aperture AP2, covers the lower electrode LE2 and overlaps part of the rib 5. The second portion OR2b is provided on the upper portion 62.

The upper electrode UE2 shown in FIG. 2 includes first and second portions UE2a and UE2b spaced apart from each other as shown in FIG. 3. The first portion UE2a faces the lower electrode LE2 and is provided on the first portion OR2a. Further, the first portion UE2a is in contact with a side surface of the lower portion 61. The second portion UE2b is located above the partition 6 and is provided on the second portion OR2b.

The first portion OR2a and the first portion UE2a are located on the lower side relative to the upper portion 62.

The organic layer OR3 shown in FIG. 2 includes first and second portions OR3a and OR3b spaced apart from each other as shown in FIG. 3. The first portion OR3a is in contact with the lower electrode LE3 through the aperture AP3, covers the lower electrode LE3 and overlaps part of the rib 5. The second portion OR3b is provided on the upper portion 62.

The upper electrode UE3 shown in FIG. 2 includes first and second portions UE3a and UE3b spaced apart from each other as shown in FIG. 3. The first portion UE3a faces the lower electrode LE3 and is provided on the first portion OR3a. Further, the first portion UE3a is in contact with a side surface of the lower portion 61. The second portion UE3b is located above the partition 6 and is provided on the second portion OR3b.

The first portion OR3a and the first portion UE3a are located on the lower side relative to the upper portion 62.

In the example shown in FIG. 3, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 includes first and second portions CP1a and CP1b spaced apart from each other. The first portion CP1a is located in the aperture AP1, is located on the lower side relative to the upper portion 62 and is provided on the first portion UE1a. The second portion CP1b is located above the partition 6 and is provided on the second portion UE1b.

The cap layer CP2 includes first and second portions CP2a and CP2b spaced apart from each other. The first portion CP2a is located in the aperture AP2, is located on the lower side relative to the upper portion 62 and is provided on the first portion UE2a. The second portion CP2b is located above the partition 6 and is provided on the second portion UE2b.

The cap layer CP3 includes first and second portions CP3a and CP3b spaced apart from each other. The first portion CP3a is located in the aperture AP3, is located on the lower side relative to the upper portion 62 and is provided on the first portion UE3a. The second portion CP3b is located above the partition 6 and is provided on the second portion UE3b.

Sealing layers SE1, SE2 and SE3 are provided in subpixels SP1, SP2 and SP3, respectively.

The sealing layer SE1 is in contact with the first portion CP1a, the lower and upper portions 61 and 62 of the partition 6 and the second portion CP1b and continuously covers the members of subpixel SP1. In the example shown in the figure, the sealing layer SE1 comprises a closed void V1 under the upper portion 62 of the partition 6 (under a protrusion 621). The void V1 is spaced apart from the partition 6. The void V1 is surrounded by, of the sealing layer SE1, the portion which is in contact with the side surface of the lower portion 61 of the partition 6, the portion which is in contact with the bottom surface of the upper portion 62 of the partition 6, and the portion which is in contact with the first portion CP1a. The void V1 is formed along the entire circumference of the partition 6 surrounding the aperture AP1. However, the void V1 may be partly eliminated. Further, the void V1 is closed overall.

The sealing layer SE2 is in contact with the first portion CP2a, the lower and upper portions 61 and 62 of the partition 6 and the second portion CP2b and continuously covers the members of subpixel SP2. The sealing layer SE2 comprises a closed void V2 under the upper portion 62 of the partition 6 (under a protrusion 622). The void V2 is located on the opposite side of the void V1 across the partition 6 shown on the left side of the figure. The void V2 is formed along the entire circumference of the partition 6 surrounding the aperture AP2. However, the void V2 may be partly eliminated. Further, the void V2 is closed overall.

The sealing layer SE3 is in contact with the first portion CP3a, the lower and upper portions 61 and 62 of the partition 6 and the second portion CP3b and continuously covers the members of subpixel SP3. The sealing layer SE3 comprises a closed void V3 under the upper portion 62 of the partition 6 (under a protrusion 623). The void V3 is located on the opposite side of the void V2 across the partition 6 shown on the right side of the figure. The void V3 is formed along the entire circumference of the partition 6 surrounding the aperture AP3. However, the void V3 may be partly eliminated. Further, the void V3 is closed overall.

The sealing layers SE1, SE2 and SE3 are covered with a protective layer 13.

In the example of FIG. 3, on the partition 6 between subpixels SP1 and SP2, the second portion OR1b of the organic layer OR1 is spaced apart from the second portion OR2b of the organic layer OR2, and the second portion UE1b of the upper electrode UE1 is spaced apart from the second portion UE2b of the upper electrode UE2, and the second portion CP1b of the cap layer CP1 is spaced apart from the second portion CP2b of the cap layer CP2, and the sealing layer SE1 is spaced apart from the sealing layer SE2. The protective layer 13 is provided between the second portion OR1b and the second portion OR2b, between the second portion UE1b and the second portion UE2b, between the second portion CP1b and the second portion CP2b and between the sealing layer SE1 and the sealing layer SE2.

On the partition 6 between subpixels SP2 and SP3, the second portion OR2b of the organic layer OR2 is spaced apart from the second portion OR3b of the organic layer OR3, and the second portion UE2b of the upper electrode UE2 is spaced apart from the second portion UE3b of the upper electrode UE3, and the second portion CP2b of the cap layer CP2 is spaced apart from the second portion CP3b of the cap layer CP3, and the sealing layer SE2 is spaced apart from the sealing layer SE3. The protective layer 13 is provided between the second portion OR2b and the second portion OR3b, between the second portion UE2b and the second portion UE3b, between the second portion CP2b and the second portion CP3b and between the sealing layer SE2 and the sealing layer SE3.

The insulating layer 12 is an organic insulating layer. The rib 5 and the sealing layers SE1, SE2 and SE3 are inorganic insulating layers.

The sealing layers SE1, SE2 and SE3 are formed of, for example, the same inorganic insulating material.

The rib 5 is formed of silicon nitride (SiNx) as an example of inorganic insulating materials. It should be noted that the rib 5 maybe formed as, as another inorganic insulating material, a single-layer body of one of silicon oxide (SiOx), silicon oxynitride (SiON) and aluminum oxide ($Al_2O_3$). The rib 5 maybe formed as a sacked layer body of a combination consisting of at least two of a silicon nitride layer, a silicon oxide layer, a silicon oxynitride layer and an aluminum oxide layer.

The sealing layers SE1, SE2 and SE3 are formed of silicon nitride (SiNx) as an example of inorganic insulating materials. It should be noted that the sealing layers SE1, SE2 and SE3 may be formed as, as another inorganic insulating material, a single-layer body of one of silicon oxide (SiOx), silicon oxynitride (SiON) and aluminum oxide ($Al_2O_3$). Each of the sealing layers SE1, SE2 and SE3 may be formed as a sacked layer body consisting of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The lower portions 61 of the partitions 6 are formed of a conductive material and are electrically connected to the first portions UE1a, UE2a and UE3a of the upper electrodes. Both the lower portion 61 and the upper portion 62 of each partition 6 maybe conductive.

The thickness T5 of the rib 5 is sufficiently less than the thicknesses of the partition 6 and the insulating layer 12. For example, the thickness T5 of the rib 5 is greater than or equal to 200 nm, and less than or equal to 400 nm.

Immediately above the lower electrode LE1 overlapping the aperture AP1, the sealing layer SE1 has thickness T1. Immediately above the lower electrode LE2 overlapping the aperture AP2, the sealing layer SE2 has thickness T2. Immediately above the lower electrode LE3 overlapping the aperture AP3, the sealing layer SE3 has thickness T3. Thickness T1, thickness T2 and thickness T3 are substantially equal to each other.

The thickness T61 of the lower portion 61 of the partition 6 (the thickness from the upper surface of the rib 5 to the lower surface of the upper portion 62) is greater than the thickness T5 of the rib 5.

The lower electrodes LE1, LE2 and LE3 may be formed of a transparent conductive material such as ITO or may comprise a multilayer structure of a metal material such as silver (Ag) and a transparent conductive material. The upper electrodes UE1, UE2 and UE3 are formed of, for example, a metal material such as an alloy of magnesium and silver (MgAg). The upper electrodes UE1, UE2 and UE3 may be formed of a transparent conductive material such as ITO.

When the potential of the lower electrodes LE1, LE2 and LE3 is relatively higher than that of the upper electrodes UE1, UE2 and UE3, the lower electrodes LE1, LE2 and LE3 correspond to anodes, and the upper electrodes UE1, UE2 and UE3 correspond to cathodes. When the potential of the upper electrodes UE1, UE2 and UE3 is relatively higher than that of the lower electrodes LE1, LE2 and LE3, the upper electrodes UE1, UE2 and UE3 correspond to anodes, and the lower electrodes LE1, LE2 and LE3 correspond to cathodes.

The organic layers OR1, OR2 and OR3 include a plurality of functional layers. The first and second portions OR1a and OR1b of the organic layer OR1 include light emitting layers EM1 formed of the same material. The first and second portions OR2a and OR2b of the organic layer OR2 include light emitting layers EM2 formed of the same material. The light emitting layers EM2 are formed of a material different from that of the light emitting layers EM1. The first and second portions OR3a and OR3b of the organic layer OR3 include light emitting layers EM3 formed of the same material. The light emitting layers EM3 are formed of a material different from the materials of the light emitting layers EM1 and EM2. The material of the light emitting layers EM1, the material of the light emitting layers EM2 and the material of the light emitting layers EM3 are materials which emit light in different wavelength ranges.

The cap layers CP1, CP2 and CP3 are formed of, for example, a multilayer body of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

The protective layer 13 is formed of a multilayer body of transparent thin films. For example, as the thin films, the multilayer body includes a thin film formed of an inorganic material and a thin film formed of an organic material.

Common voltage is applied to the partition 6. This common voltage is applied to, of the upper electrodes, the first portions UE1a, UE2a and UE3a which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the first portion OR1a of the organic layer OR1 emits light in a red wavelength range. When a potential difference is formed between the lower electrode LE2 and the upper electrode UE2, the light emitting layer EM2 of the first portion OR2a of the organic layer OR2 emits light in a blue wavelength range. When a potential difference is formed between the lower electrode LE3 and the upper electrode UE3, the light emitting layer EM3 of the first portion OR3a of the organic layer OR3 emits light in a green wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including a quantum dot which generates light exhibiting colors corresponding to subpixels SP1, SP2 and SP3 by the excitation caused by the light emitted from the light emitting layers.

Figure 4:
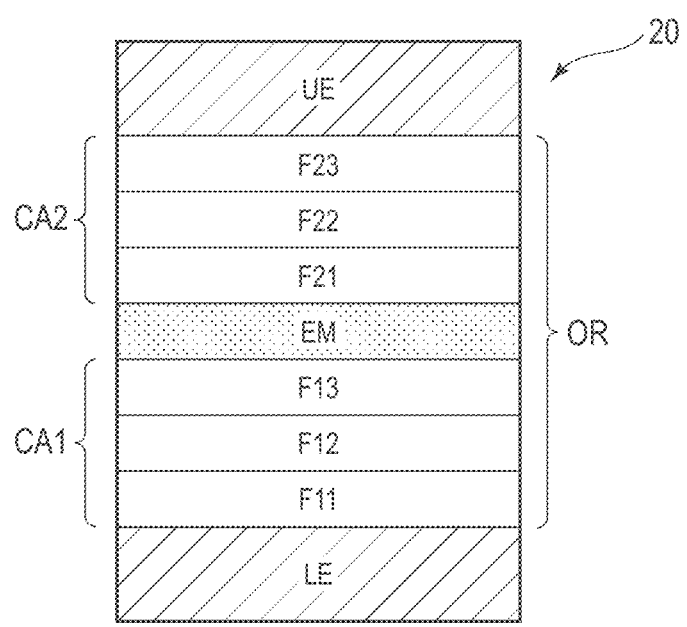
FIG. 4 is a diagram showing an example of the configuration of a display element 20.

FIG. 4 is a diagram showing an example of the configuration of the display element 20.

The lower electrode LE shown in FIG. 4 corresponds to each of the lower electrodes LE1, LE2 and LE3 of FIG. 3. The organic layer OR shown in FIG. 4 corresponds to each of the organic layers OR1, OR2 and OR3 of FIG. 3. The upper electrode UE shown in FIG. 4 corresponds to each of the upper electrodes UE1, UE2 and UE3 of FIG. 3.

The organic layer OR comprises a carrier adjustment layer CA1, a light emitting layer EM and a carrier adjustment layer CA2. The carrier adjustment layer CA1 is located between the lower electrode LE and the light emitting layer EM. The carrier adjustment layer CA2 is located between the light emitting layer EM and the upper electrode UE. The carrier adjustment layers CA1 and CA2 include a plurality of functional layers. Hereinafter, this specification explains an example in which the lower electrode LE corresponds to an anode and the upper electrode UE is corresponds to a cathode.

The carrier adjustment layer CA1 includes a hole-injection layer F11, a hole-transport layer F12, an electron blocking layer F13 and the like as functional layers. The hole-injection layer F11 is provided on the lower electrode LE. The hole-transport layer F12 is provided on the hole-injection layer F11. The electron blocking layer F13 is provided on the hole-transport layer F12. The light emitting layer EM is provided on the electron blocking layer F13.

The carrier adjustment layer CA2 includes a hole blocking layer F21, an electron-transport layer F22, an electron-injection layer F23 and the like as functional layers. The hole blocking layer F21 is provided on the light emitting layer EM. The electron-transport layer F22 is provided on the hole blocking layer F21. The electron-injection layer F23 is provided on the electron-transport layer F22. The upper electrode UE is provided on the electron-injection layer F23.

In addition to the functional layers described above, the carrier adjustment layers CA1 and CA2 may include other functional layers such as a carrier generation layer as needed, or at least one of the above functional layers may be omitted.

Figure 5B:
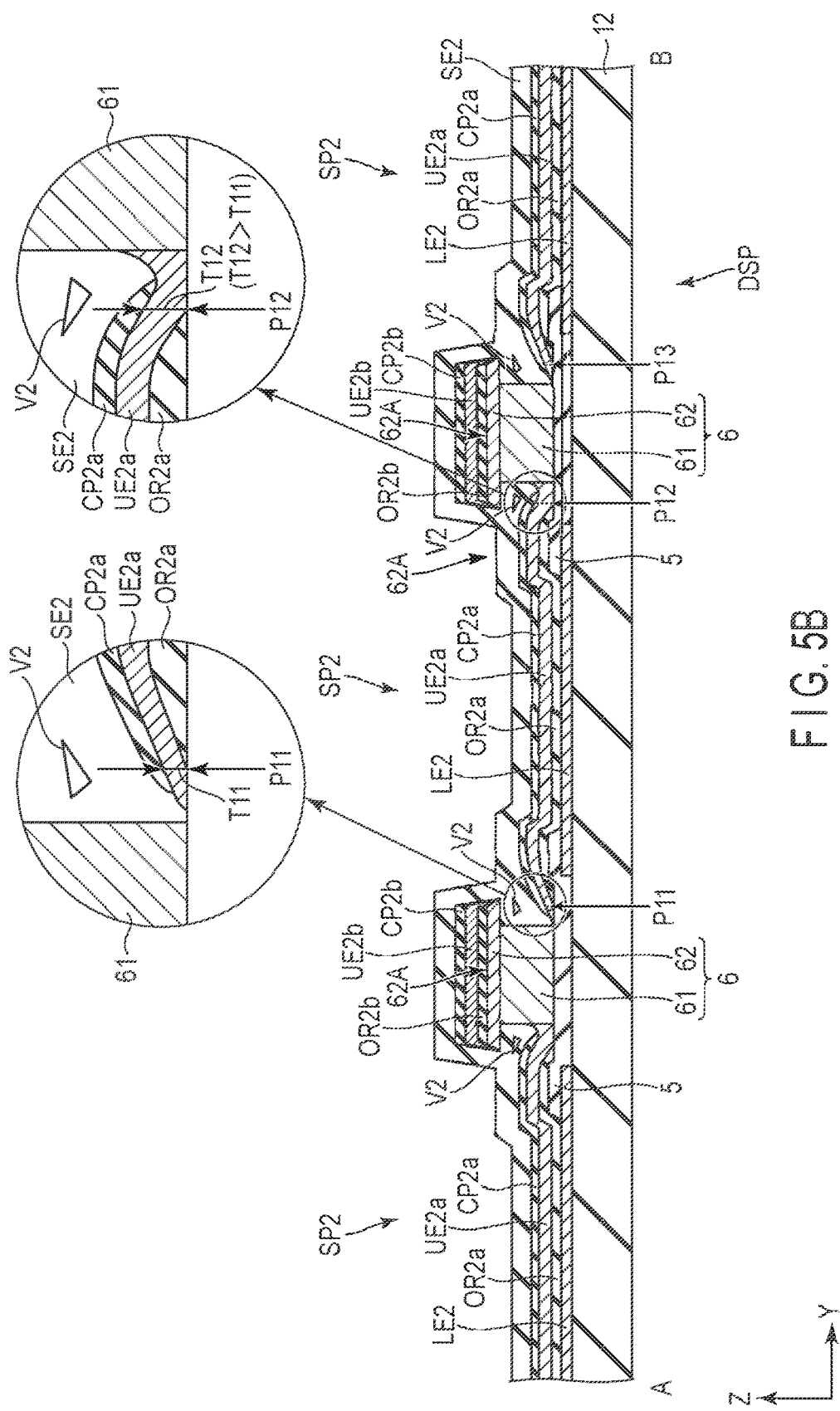

FIGS. 5A and 5B are schematic cross-sectional views of the display device DSP along the A-B line of FIG. 2. The cross-sectional views shown in FIGS. 5A and 5B include a plurality of subpixels SP2 arranged in the second direction Y. The illustrations of the substrate, the circuit layer and the protective layer shown in FIG. 3 are omitted.

Now, this specification focuses attention on the subpixel SP2 located in the center of the figure. The first portion OR2a of the organic layer OR2 comprises an end portion P11 in the second direction Y, and an end portion P12 on the opposite side of the end portion P11. The end portion P11 and the end portion P12 are located on the rib 5 and are spaced apart from the lower portions 61 of the partitions 6. The end portion P11 and the end portion P12 are located immediately under the upper portions 62 of the partitions 6. Further, the end portion P11 and the end portion P12 are located immediately under the voids V2 formed in the sealing layer SE2.

In the first portion UE2a of the upper electrode UE2, the thickness T12 immediately above the end portion P12 is greater than the thickness T11 immediately above the end portion P11 (T12>T11). The first portion UE2a is in contact with the lower portion 61 of the partition 6 which faces the end portion P12 in the second direction Y. The first portion UE2a may be in contact with the lower portion 61 which faces the end portion P11 in the second direction Y (FIG. 5A), or may not be in contact with the lower portion 61 which faces the end portion P11 (FIG. 5B). The contact area of the first portion UE2a and the lower portion 61 which faces the end portion P12 is greater than the contact area of the first portion UE2a and the lower portion 61 which faces the end portion P11.

The sealing layer SE2 covers the first and second portions CP2a and CP2b of the cap layer CP2. Between the end portion P12 and the partition 6, the first portion UE2a is exposed from the first portion CP2a of the cap layer CP2 and is covered with the sealing layer SE2.

The second portion OR2b of the organic layer OR2, the second portion UE2b of the upper electrode UE2 and the second portion CP2b of the cap layer CP2 are formed as a stacked layer body and are provided over the entire upper surface 62A of the upper portion 62 of the partition 6.

In the subpixel SP2 located on the right side of the figure, similarly, the first portion OR2a of the organic layer OR2 comprises an end portion P13. Immediately above the end portion P13, the thickness of the first portion UE2a of the upper electrode UE2 is equal to the thickness T11 immediately above the end portion P11 and is less than thickness T12 although details are omitted.

In the examples shown in FIGS. 5A and 5B, for example, the end portion P11 corresponds to a first end portion, and the end portion P12 corresponds to a second end portion.

Figure 6:
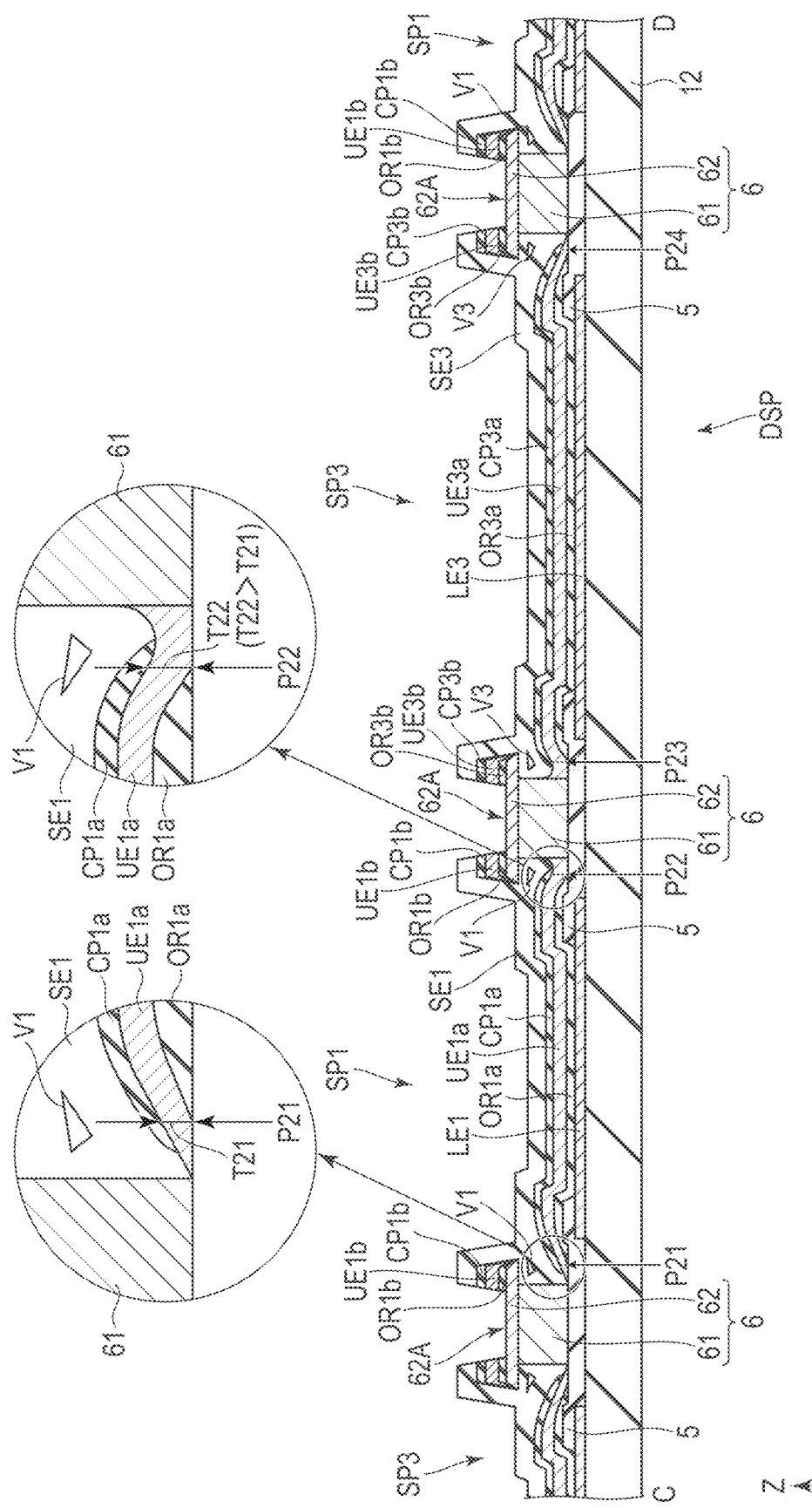
FIG. 6 is a schematic cross-sectional view of the display device DSP along the C-D line of FIG. 2.

FIG. 6 is a schematic cross-sectional view of the display device DSP along the C-D line of FIG. 2. The cross-sectional view shown in FIG. 6 includes subpixels SP1 and SP3 which are alternately arranged in the second direction Y. The illustrations of the substrate, the circuit layer and the protective layer shown in FIG. 3 are omitted.

Now, this specification focuses attention on the subpixel SP1 located on the left side of the figure. The first portion OR1a of the organic layer OR1 comprises an end portion P21 in the second direction Y, and an end portion P22 on the opposite side of the end portion P21. The end portion P21 and the end portion P22 are located on the rib 5 and are spaced apart from the lower portions 61 of the partitions 6. The end portion P21 and the end portion P22 are located immediately under the upper portions 62 of the partitions 6. Further, the end portion P21 and the end portion P22 are located immediately under the voids V1 formed in the sealing layer SE1.

In the first portion UE1a of the upper electrode UE1, the thickness T22 immediately above the end portion P22 is greater than the thickness T21 immediately above the end portion P21 (T22>T21). The first portion UE1a is in contact with the lower portion 61 of the partition 6 which faces the end portion P22 in the second direction Y. The first portion UE1a may be in contact with the lower portion 61 which faces the end portion P21 in the second direction Y, or may not be in contact with the lower portion 61 which faces the end portion P21. The contact area of the first portion UE1a and the lower portion 61 which faces the end portion P22 is greater than the contact area of the first portion UE1a and the lower portion 61 which faces the end portion P21.

The sealing layer SE1 covers the first and second portions CP1a and CP1b of the cap layer CP1. Between the end portion P22 and the partition 6, the first portion UE1a is exposed from the first portion CP1a of the cap layer CP1 and is covered with the sealing layer SE1.

The second portion OR1b of the organic layer OR1, the second portion UE1b of the upper electrode UE1 and the second portion CP1b of the cap layer CP1 are formed as a stacked layer body such that part of the upper surface 62A of the upper portion 62 of the partition 6 is exposed.

Now, this specification focuses attention on the subpixel SP3 located on the right side of the figure. The first portion OR3a of the organic layer OR3 comprises an end portion P23 in the second direction Y, and an end portion P24 on the opposite side of the end portion P23. The end portion P23 and the end portion P24 are located on the rib 5 and are spaced apart from the lower portions 61 of the partitions 6. The end portion P23 and the end portion P24 are located immediately under the upper portions 62 of the partitions 6. Further, the end portion P23 and the end portion P24 are located immediately under the voids V3 formed in the sealing layer SE3.

In the first portion UE3a of the upper electrode UE3, the thickness immediately above the end portion P23 is greater than the thickness immediately above the end portion P24. The first portion UE3a is in contact with the lower portion 61 of the partition 6 which faces the end portion P23 in the second direction Y. The first portion UE3a may be in contact with the lower portion 61 which faces the end portion P24 in the second direction Y, or may not be in contact with the lower portion 61 which faces the end portion P24. The contact area of the first portion UE3a and the lower portion 61 which faces the end portion P23 is greater than the contact area of the first portion UE3a and the lower portion 61 which faces the end portion P24.

Between the end portion P23 and the partition 6, the first portion UE3a is exposed from the first portion CP3a of the cap layer CP3 and is covered with the sealing layer SE3.

The second portion OR3b of the organic layer OR3, the second portion UE3b of the upper electrode UE3 and the second portion CP3b of the cap layer CP3 are formed as a stacked layer body such that part of the upper surface 62A of the upper portion 62 of the partition 6 is exposed.

In the example shown in FIG. 6, regarding subpixel SP1, the end portion P21 corresponds to the first end portion, and the end portion P22 corresponds to the second end portion. Regarding subpixel SP3, the end portion P23 corresponds to the second end portion, and the end portion P24 corresponds to the first end portion.

Now, this specification explains an evaporation device EV for forming an upper electrode.

Figure 7:
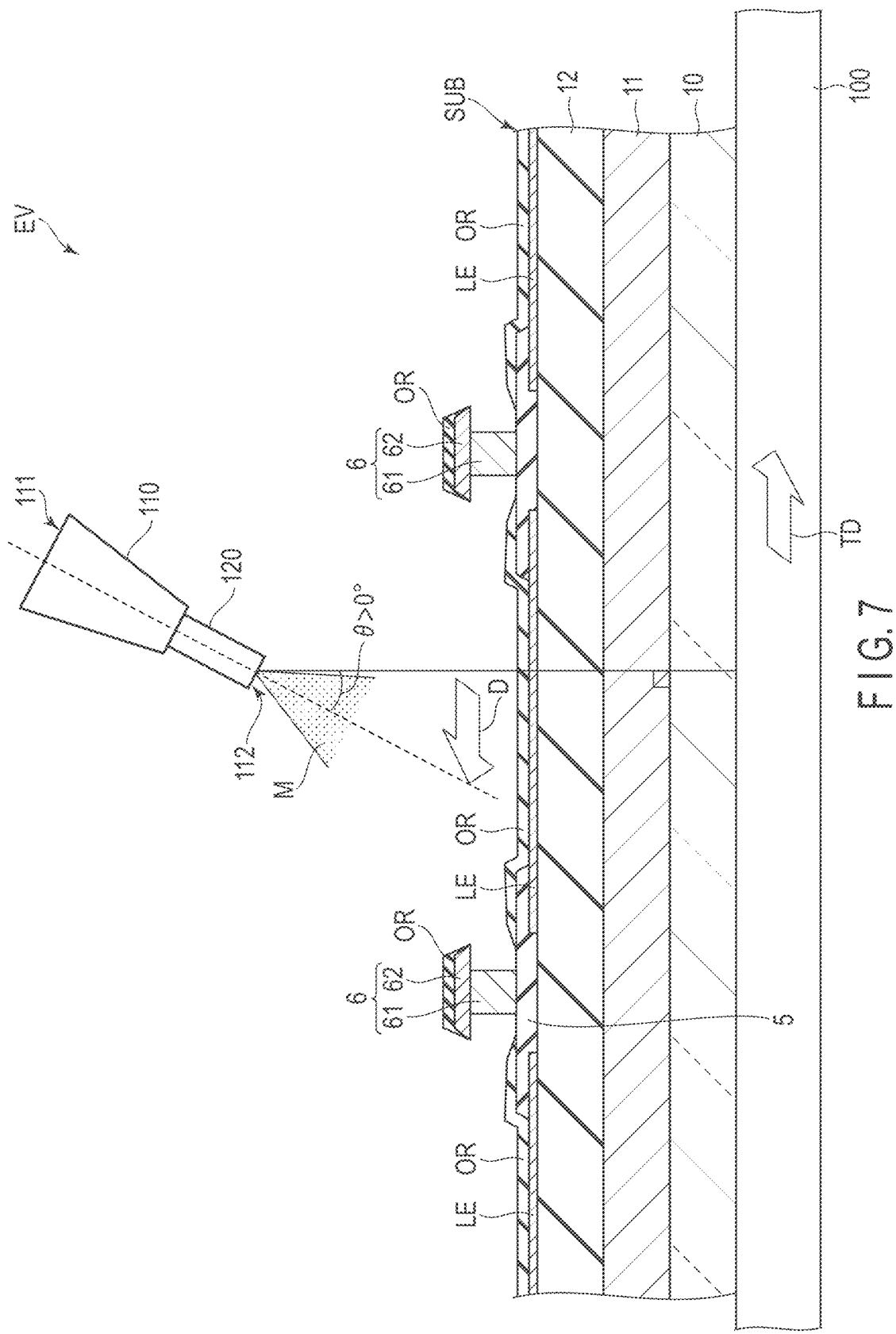
FIG. 7 is a diagram for explaining an evaporation device EV.

FIG. 7 is a diagram for explaining the evaporation device EV.

The evaporation device EV comprises a conveyance mechanism 100 and an evaporation source 110.

The conveyance mechanism 100 conveys a processing substrate SUB. The processing substrate SUB shown here is prepared by forming the circuit layer 11, the insulating layer 12, the lower electrode LE, the rib 5, the partition 6 and the organic layer OR on the substrate 10. The conveyance direction TD of the processing substrate SUB by the conveyance mechanism 100 is shown by an arrow in the figure.

The evaporation source 110 emits a conductive material M for forming an upper electrode. The extension direction of the evaporation source 110 inclines with respect to the normal of the substrate 10 as shown by the dotted line in the figure. Here, the extension direction is, for example, the direction in which a sleeve 120 controlling the emission direction of the conductive material M extends. The angle θ between the normal of the substrate 10 and the extension direction of the evaporation source 110 is, for example, greater than or equal to 5°, and less than or equal to 40°. The evaporation direction D of the conductive material M by the evaporation source 110 is shown by an arrow in the figure. The evaporation direction D is the direction from the bottom portion 111 of the evaporation source 110 toward the opening portion 112 of the evaporation source 110. The evaporation direction D is the opposite direction of the conveyance direction TD.

In the evaporation device EV, the evaporation source 110 is fixed, and the conductive material M is deposited on the processing substrate SUB while the processing substrate SUB is conveyed in one direction. In this way, an upper electrode is formed on the organic layer OR. The conductive material M is an alloy of magnesium and silver.

Figure 8:
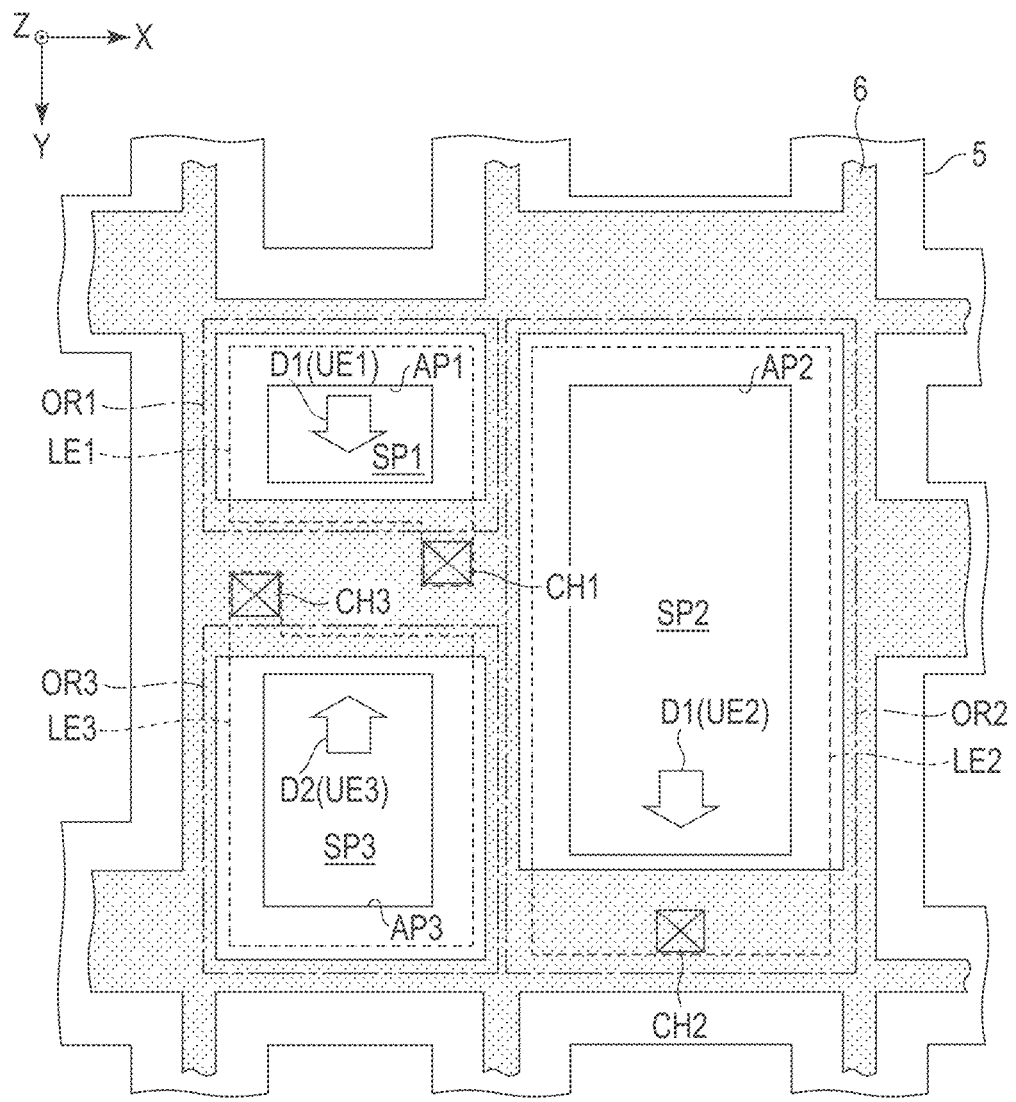
FIG. 8 is a diagram for explaining an evaporation direction D when an upper electrode is formed in each subpixel.

FIG. 8 is a diagram for explaining the evaporation direction D when an upper electrode is formed in each subpixel.

In subpixel SP1, the aperture AP1 of the rib 5 overlaps the lower electrode LE1, and the organic layer OR1 is formed on the lower electrode LE1 in the aperture AP1. The evaporation direction D1 for forming the upper electrode UE1 on the organic layer OR1 is shown by an arrow in the figure.

In subpixel SP2, the aperture AP2 of the rib 5 overlaps the lower electrode LE2, and the organic layer OR2 is formed on the lower electrode LE2 in the aperture AP2. The evaporation direction D1 for forming the upper electrode UE2 on the organic layer OR2 is the same as the evaporation direction D1 for forming the upper electrode UE1 in subpixel SP1 as shown by the arrows in the figure.

In subpixel SP3, the aperture AP3 of the rib 5 overlaps the lower electrode LE3, and the organic layer OR3 is formed on the lower electrode LE3 in the aperture AP3. The evaporation direction D2 for forming the upper electrode UE3 on the organic layer OR3 is different from the evaporation direction D1 for forming the upper electrode UE1 in subpixel SP1 as shown by the arrows in the figure.

These evaporation directions D1 and D2 are substantially parallel to the direction (the second direction Y) in which the lower electrode LE1 and the lower electrode LE3 are arranged, and are opposite directions.

Figure 9:
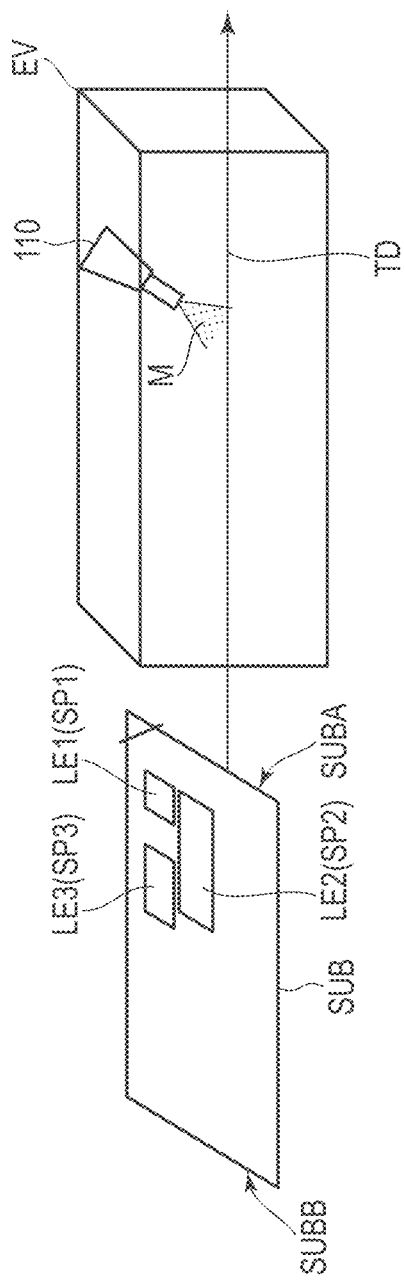
FIG. 9 is a diagram for explaining a conveyance direction TD when an upper electrode is formed.

FIG. 9 is a diagram for explaining the conveyance direction TD when an upper electrode is formed.

The example of the figure shows the conveyance direction TD of the processing substrate SUB when the upper electrode UE1 of subpixel SP1 or the upper electrode UE2 of subpixel SP2 is formed. The processing substrate SUB comprises an end SUBA in the conveyance direction TD and the other end SUBB on the opposite side of the end SUBA. In the example shown in the figure, the processing substrate SUB is introduced into the evaporation device EV such that the end SUBA is the leading end. In the evaporation device EV, the conductive material M emitted from the evaporation source 110 is deposited while the processing substrate SUB is conveyed such that the end SUBA is the leading end.

Figure 10:
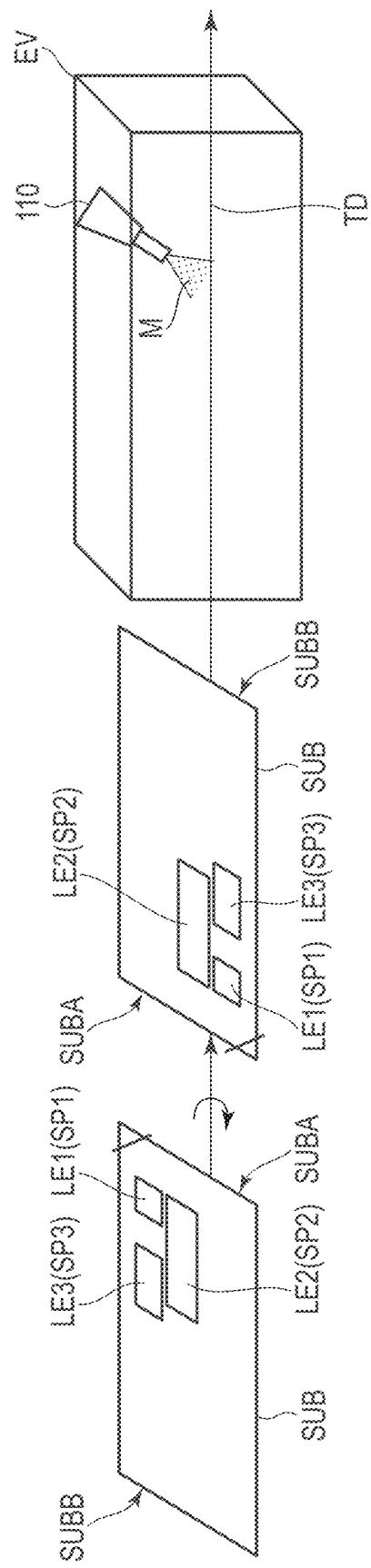
FIG. 10 is a diagram for explaining another conveyance direction TD when an upper electrode is formed.

FIG. 10 is a diagram for explaining another conveyance direction TD when an upper electrode is formed.

The example of the figure shows the conveyance direction TD of the processing substrate SUB when the upper electrode UE3 of subpixel SP3 is formed. For example, in a case where the upper electrode UE3 is formed after the formation of the upper electrode UE1 or the upper electrode UE2, the processing substrate SUB is firstly conveyed such that the end SUBA is the leading end, and subsequently, the processing substrate SUB is rotated 180° in the plane of the substrate before the upper electrode UE3 is formed. Subsequently, the processing substrate SUB is introduced into the evaporation device EV such that the other end SUBB is the leading end. In the evaporation device EV, the conductive material M emitted from the evaporation source 110 is deposited while the processing substrate SUB is conveyed such that the other end SUBB is the leading end.

In this way, the conveyance direction of the processing substrate SUB for forming the upper electrode UE1 or the upper electrode UE2 is different from that for forming the upper electrode UE3.

Figure 11:
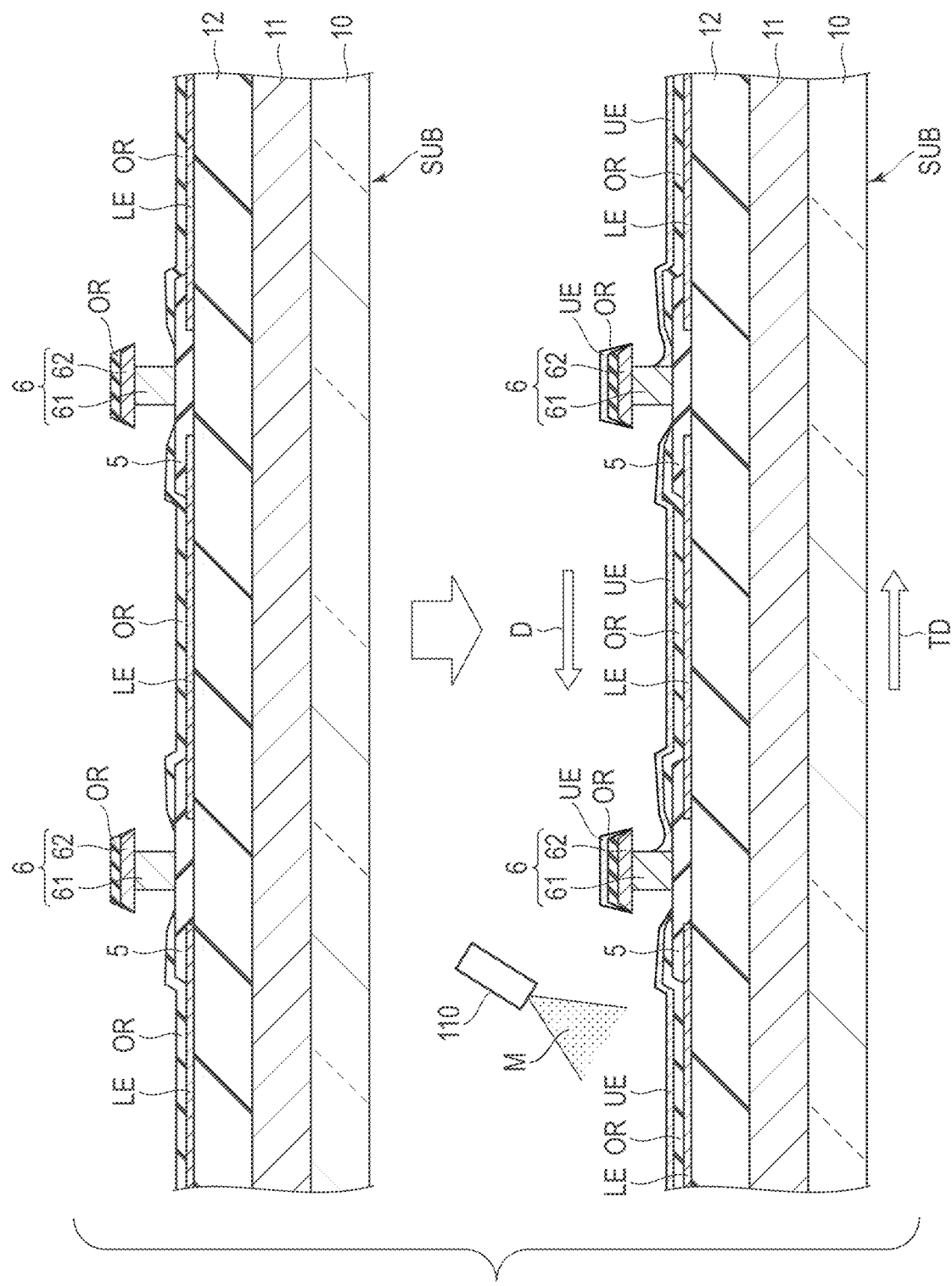
FIG. 11 is a diagram for explaining how an upper electrode is formed.

FIG. 11 is a diagram for explaining how an upper electrode is formed.

The upper part of FIG. 11 shows the processing substrate SUB before an upper electrode is formed (in other words, before the processing substrate SUB being introduced into the evaporation device).

The lower part of FIG. 11 shows the processing substrate SUB after the upper electrode UE is formed. The distal end of the arrow indicating the conveyance direction TD corresponds to the proximal end of the arrow indicating the evaporation direction D. The proximal end of the arrow indicating the conveyance direction TD corresponds to the distal end of the arrow indicating the evaporation direction D.

Whereas the conductive material M emitted from the evaporation source 110 is blocked by the partition 6 on the proximal end side of the evaporation direction D, the conductive material M is applied around to the lower portion 61 of the partition 6 on the distal end side of the evaporation direction D. Thus, regarding the upper electrode UE of a subpixel, the distal end side of the evaporation direction D is made thick, and the proximal end side of the evaporation direction D is made thin. On the distal end side of the evaporation direction D, the upper electrode UE is surely in contact with the lower portion 61 of the partition 6, and they are electrically connected to each other. This configuration prevents the defect of the electric connection between the upper electrode UE and the lower portion 61 compared with a case where the extension direction of the evaporation source 110 is parallel to the normal of the substrate 10. Further, as more conductive materials M are applied around to the lower portion 61 on the distal end side of the evaporation direction D, the contact area of the upper electrode UE and the lower portion 61 is increased, thereby decreasing the contact resistance. In this way, the reduction in reliability can be prevented.

In the above examples shown in FIG. 7 to FIG. 11, the aperture AP1 corresponds to a first aperture. The aperture AP3 corresponds to a second aperture. The lower electrode LE1 corresponds to a first lower electrode. The lower electrode LE3 corresponds to a second lower electrode. The organic layer OR1 corresponds to a first organic layer. The organic layer OR3 corresponds to a second organic layer. The light emitting layer EM1 corresponds to a first light emitting layer. The light emitting layer EM3 corresponds to a second light emitting layer. The upper electrode UE1 corresponds to a first upper electrode. The upper electrode UE3 corresponds to a second upper electrode. The cap layer CP1 corresponds to a first cap layer. The cap layer CP3 corresponds to a second cap layer. The sealing layer SE1 corresponds to a first sealing layer. The sealing layer SE3 corresponds to a second sealing layer.

The evaporation device EV of the examples shown in FIG. 7, FIG. 9, FIG. 10 and FIG. 11 corresponds to a case where the evaporation device EV is configured such that the processing substrate SUB is conveyed in a state where the evaporation surface of the processing substrate SUB is located on the upper side of the substrate 10 (face-up) and the evaporation source 110 emits the conductive material M toward the lower side. However, the evaporation device EV is not limited to this configuration. For example, the evaporation device EV may be configured such that the processing substrate SUB is conveyed in a state where the evaporation surface of the processing substrate SUB is located on the lower side of the substrate 10 (face-down) and the evaporation source 110 emits the conductive material M toward the upper side. The evaporation source EV may be configured such that the processing substrate SUB is conveyed in a state where the processing substrate SUB perpendicularly stands and the evaporation source 110 emits the conductive material M in a lateral direction.

Now, this specification explains an example of the manufacturing method of the display device DSP.

Figure 12:
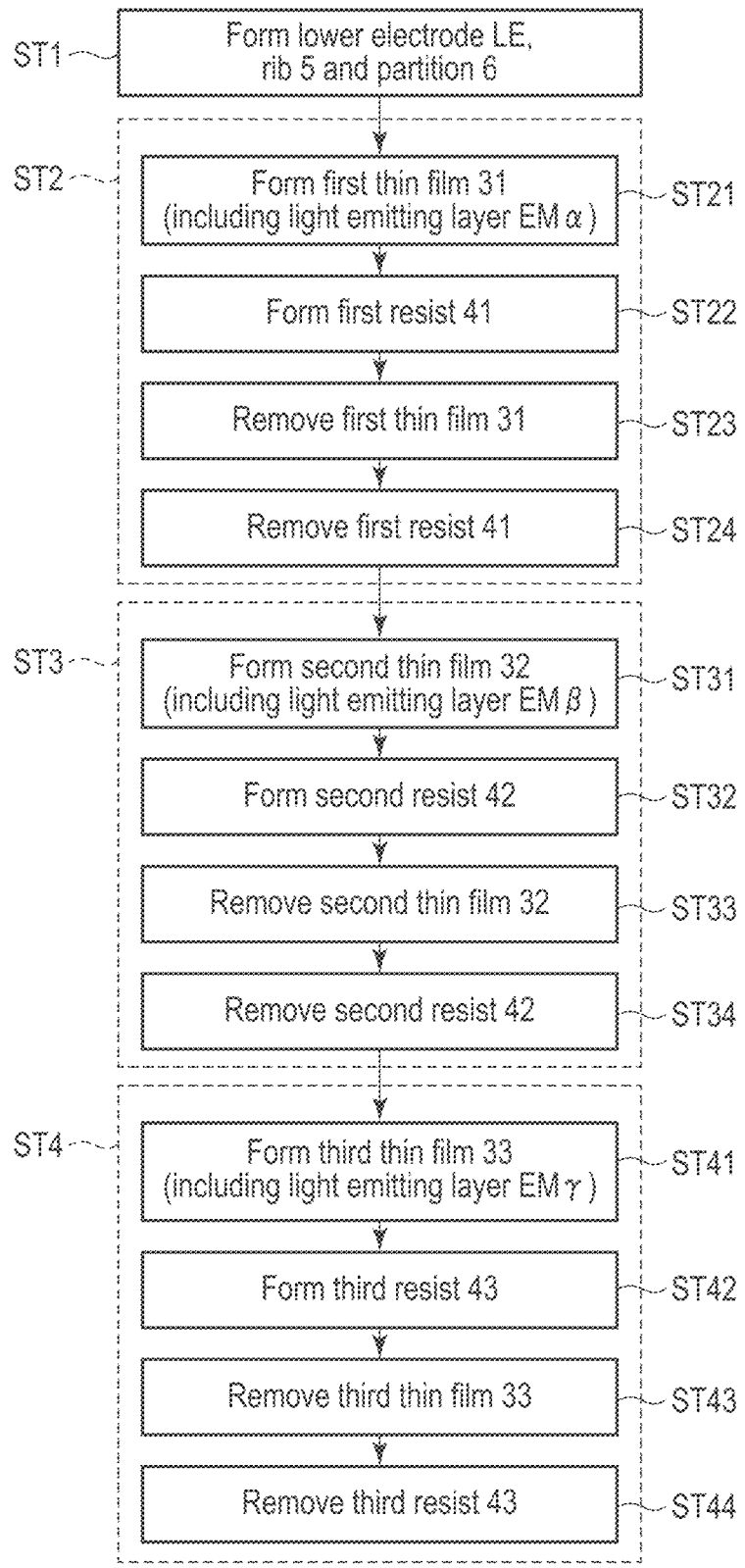
FIG. 12 is a flow diagram for explaining an example of the manufacturing method of the display device DSP.

FIG. 12 is a flow diagram for explaining an example of the manufacturing method of the display device DSP.

The manufacturing method shown here roughly includes the process of preparing the processing substrate SUB which is the base of subpixels SPα, SPβ and SPγ (step ST1), the process of forming subpixel SPα (step ST2), the process of forming subpixel SPβ (step ST3) and the process of forming subpixel SPγ (step ST4). It should be noted that each of subpixels SPα, SPβ and SPγ here is one of the above subpixels SP1, SP2 and SP3.

In step ST1, first, the processing substrate SUB is prepared by forming lower electrodes LEα, LEβ and LEγ, the rib 5 and the partition 6 on the substrate 10. As shown in FIG. 3, the circuit layer 11 and the insulating layer 12 are also formed between the substrate 10 and the lower electrodes LEα, LEβ and LEγ.

In step ST2, first, a first thin film 31 including a light emitting layer EMα is formed on the processing substrate SUB (step ST21). Subsequently, a first resist 41 patterned into a predetermined shape is formed on the first thin film 31 (step ST22). Subsequently, part of the first thin film 31 is removed by etching using the first resist 41 as a mask (step ST23). Subsequently, the first resist 41 is removed (step ST24). In this way, subpixel SPα is formed. Subpixel SPα comprises a display element 21 comprising the first thin film 31 having a predetermined shape.

In step ST3, first, a second thin film 32 including a light emitting layer EMβ is formed on the processing substrate SUB (step ST31). Subsequently, a second resist 42 patterned into a predetermined shape is formed on the second thin film 32 (step ST32). Subsequently, part of the second thin film 32 is removed by etching using the second resist 42 as a mask (step ST33). Subsequently, the second resist 42 is removed (step ST34). In this way, subpixel SPβ is formed. Subpixel SPβ comprises a display element 22 comprising the second thin film 32 having a predetermined shape.

In step ST4, first, a third thin film 33 including a light emitting layer EMγ is formed on the processing substrate SUB (step ST41). Subsequently, a third resist 43 patterned into a predetermined shape is formed on the third thin film 33 (step ST42). Subsequently, part of the third thin film 33 is removed by etching using the third resist 43 as a mask (step ST43). Subsequently, the third resist 43 is removed (step ST44). In this way, subpixel SPγ is formed. Subpixel SPγ comprises a display element 23 comprising the third thin film 33 having a predetermined shape.

The light emitting layer EMα, the light emitting layer EMβ and the light emitting layer EMγ are formed of materials which emit light in different wavelength ranges.

The detailed illustrations of the second thin film 32, the light emitting layer EMβ, the display element 22, the third thin film 33, the light emitting layer EMγ and the display element 23 are omitted.

Now, this specification explains step ST1 and step ST2 with reference to FIG. 13 to FIG. 17. The section shown in each of FIG. 13 to FIG. 17 corresponds to, for example, the section taken along the III-III line of FIG. 2.

Figure 13:
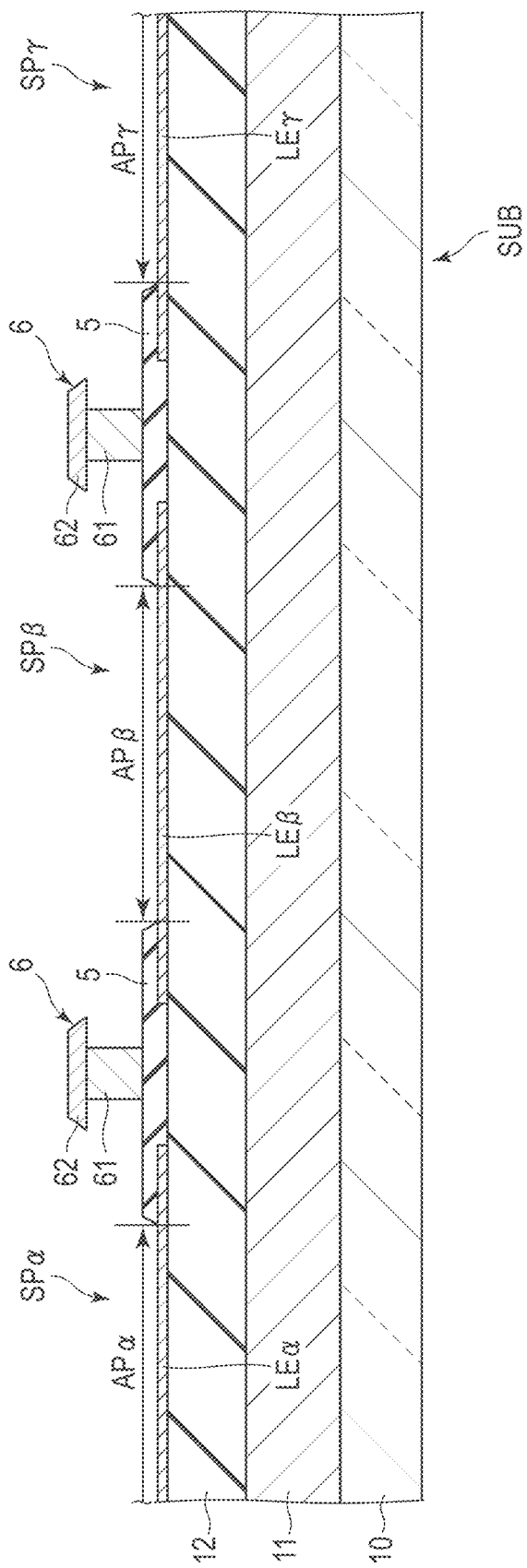
FIG. 13 is a diagram for explaining step ST1.

First, in step ST1, as shown in FIG. 13, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LEα of subpixel SPα, the lower electrode LEβ of subpixel SPβ and the lower electrode LEγ of subpixel SPγ on the insulating layer 12, the process of forming the rib 5 comprising apertures APα, APβ and APγ overlapping the lower electrodes LEα, LEβ and LEγ, respectively, and the process of forming the partition 6 including the lower portion 61 provided on the rib 5 and the upper portion 62 provided on the lower portion 61 and protruding from a side surface of the lower portion 61. In FIG. 14 to FIG. 17, the illustrations of the substrate 10 and the circuit layer 11 lower than the insulating layer 12 are omitted.

Figure 14:
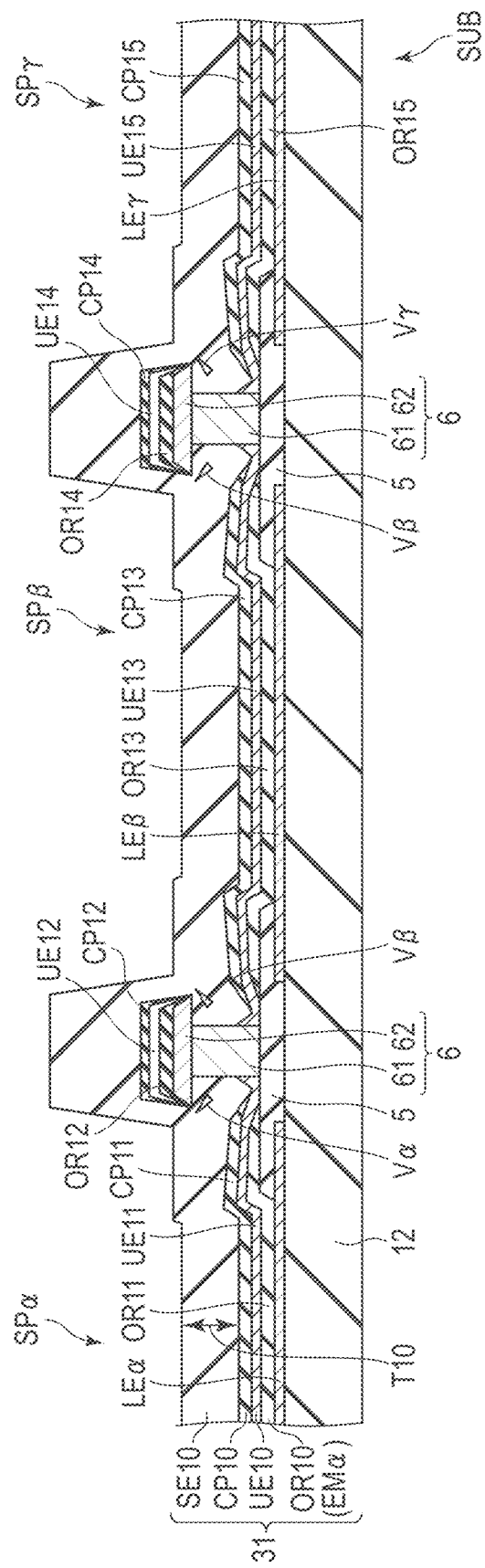
FIG. 14 is a diagram for explaining step ST21.

Subsequently, in step ST21, as shown in FIG. 14, the first thin film 31 is formed over subpixel SPα, subpixel SPβ and subpixel SPγ. The process of forming the first thin film 31 includes, on the processing substrate SUB, the process of forming an organic layer OR10 including a light emitting layer EMα, the process of forming an upper electrode UE10 on the organic layer OR10, the process of forming a cap layer CP10 on the upper electrode UE10 and the process of forming a sealing layer SE10 on the cap layer CP10. Thus, in the example shown in the figure, the first thin film 31 includes the organic layer OR10, the upper electrode UE10, the cap layer CP10 and the sealing layer SE10. The process of forming the upper electrode UE10 is performed by the evaporation device EV explained with reference to FIG. 7 to FIG. 11.

The organic layer OR10 includes an organic layer OR11, an organic layer OR12, an organic layer OR13, an organic layer OR14 and an organic layer OR15. Each of the organic layer OR11, the organic layer OR12, the organic layer OR13, the organic layer OR14 and the organic layer OR15 includes a light emitting layer EMα.

The organic layer OR11 is formed so as to cover the lower electrode LEα. The organic layer OR12 is spaced apart from the organic layer OR11 and is located on the upper portion 62 of the partition 6 between the lower electrode LEα and the lower electrode LEβ. The organic layer OR13 is spaced apart from the organic layer OR12 and is formed so as to cover the lower electrode LEβ. The organic layer OR14 is spaced apart from the organic layer OR13 and is located on the upper portion 62 of the partition 6 between the lower electrode LEβ and the lower electrode LEγ. The organic layer OR15 is spaced apart from the organic layer OR14 and is formed so as to cover the lower electrode LEγ.

The upper electrode UE10 includes an upper electrode UE11, an upper electrode UE12, an upper electrode UE13, an upper electrode UE14 and an upper electrode UE15.

The upper electrode UE11 is located on the organic layer OR11 and is in contact with the lower portion 61 of the partition 6 between the lower electrode LEα and the lower electrode LEβ. The upper electrode UE12 is spaced apart from the upper electrode UE11 and is located on the organic layer OR12 between the lower electrode LEα and the lower electrode LEβ. The upper electrode UE13 is spaced apart from the upper electrode UE12 and is located on the organic layer OR13. In the example shown in the figure, the upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ. However, the upper electrode UE13 may be in contact with one of these lower portions 61. The upper electrode UE14 is spaced apart from the upper electrode UE13 and is located on the organic layer OR14 between the lower electrode LEβ and the lower electrode LEγ. The upper electrode UE15 is spaced apart from the upper electrode UE14, is located on the organic layer OR15 and is in contact with the lower portion 61 of the partition 6 between the lower electrode LEβ and the lower electrode LEγ.

The cap layer CP10 includes a cap layer CP11, a cap layer CP12, a cap layer CP13, a cap layer CP14 and a cap layer CP15.

The cap layer CP11 is located on the upper electrode UE11. The cap layer CP12 is spaced apart from the cap layer CP11 and is located on the upper electrode UE12. The cap layer CP13 is spaced apart from the cap layer CP12 and is located on the upper electrode UE13. The cap layer CP14 is spaced apart from the cap layer CP13 and is located on the upper electrode UE14. The cap layer CP15 is spaced apart from the cap layer CP14 and is located on the upper electrode UE15.

The sealing layer SE10 is formed so as to cover the cap layer CP11, the cap layer CP12, the cap layer CP13, the cap layer CP14, the cap layer CP15 and the partitions 6. The sealing layer SE10 which covers the partitions 6 is in contact with the lower parts of the upper portions 62 and is in contact with the side surfaces of the lower portions 61. The sealing layer SE10 comprises a void Vα so as to face subpixel SPα of the partition 6, comprises a void Vβ so as to face subpixel SPβ of the partition 6 and comprises a void Vγ so as to face subpixel SPγ of the partition 6.

Figure 15:
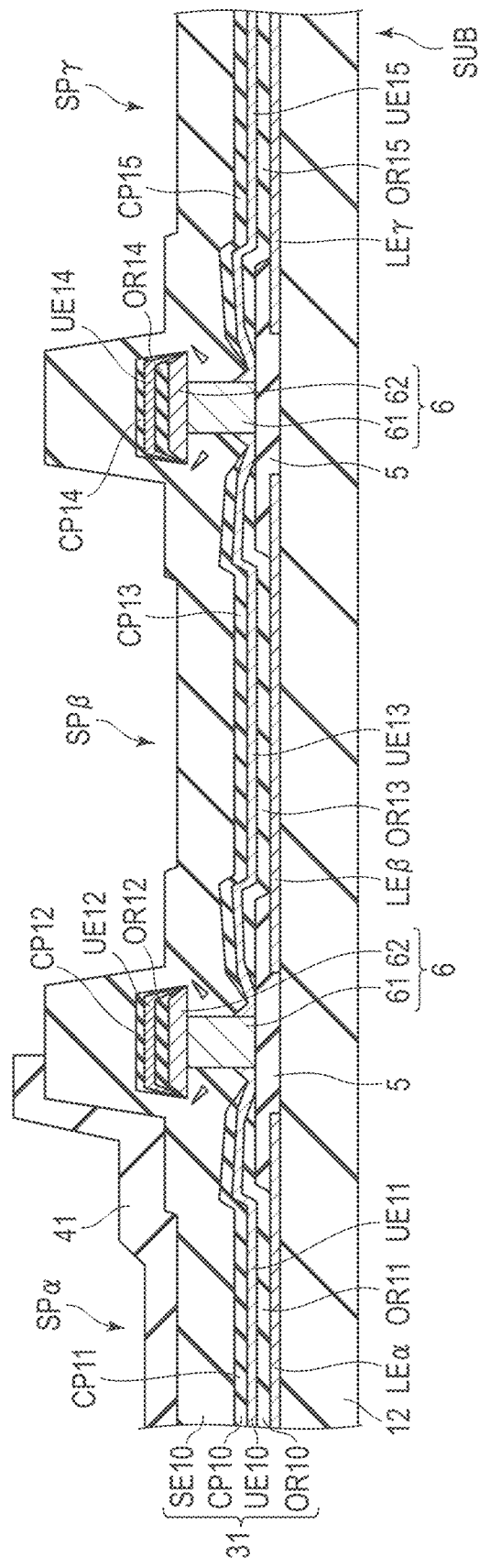
FIG. 15 is a diagram for explaining step ST22.

Subsequently, in step ST22, as shown in FIG. 15, the first resist 41 is formed on the sealing layer SE10. The first resist 41 covers subpixel SPα. Thus, the first resist 41 is provided immediately above the lower electrode LEα, the organic layer OR11, the upper electrode UE11 and the cap layer CP11. The first resist 41 extends from subpixel SPα to the upper side of the partition 6. Between subpixel SPα and subpixel SPβ, the first resist 41 is provided on the subpixel SPα side (the left side of the figure), and the sealing layer SE10 is exposed from the first resist 41 on the subpixel SPβ side (the right side of the figure). In the example shown in the figure, the sealing layer SE10 is exposed from the first resist 41 in subpixel SPβ and subpixel SPγ.

Figure 16:
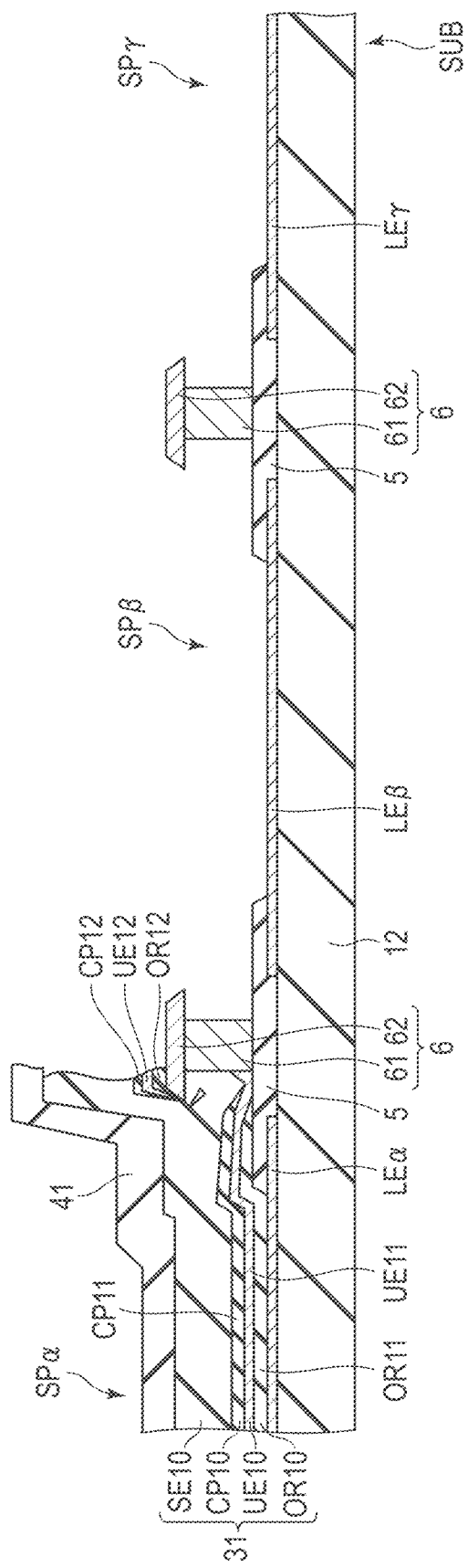
FIG. 16 is a diagram for explaining step ST23

Subsequently, in step ST23, as shown in FIG. 16, part of the first thin film 31 is removed by performing etching using the first resist 41 as a mask.

First, the sealing layer SE10 exposed from the first resist 41 is removed. Subsequently, the cap layer CP10 exposed from the first resist 41 and the sealing layer SE10 is removed. Subsequently, the upper electrode UE10 exposed from the first resist 41, the sealing layer SE10 and the cap layer CP10 is removed. Subsequently, the organic layer OR10 exposed from the first resist 41, the sealing layer SE10, the cap layer CP10 and the upper electrode UE10 is removed.

Thus, the lower electrode LEβ is exposed in subpixel SPβ, and the lower electrode LEγ is exposed in subpixel SPγ. Regarding the partition 6 between subpixel SPα and subpixel SPβ, immediately above the upper portion 62, the organic layer OR12, the upper electrode UE12, the cap layer CP12 and the sealing layer SE10 remain on the subpixel SPα side, and the organic layer OR12, the upper electrode UE12, the cap layer CP12 and the sealing layer SE10 are removed on the subpixel SPβ side. Thus, the subpixel SPβ side of the partition 6 is exposed.

The partition 6 between subpixel SPβ and subpixel SPγ is also exposed.

Figure 17:
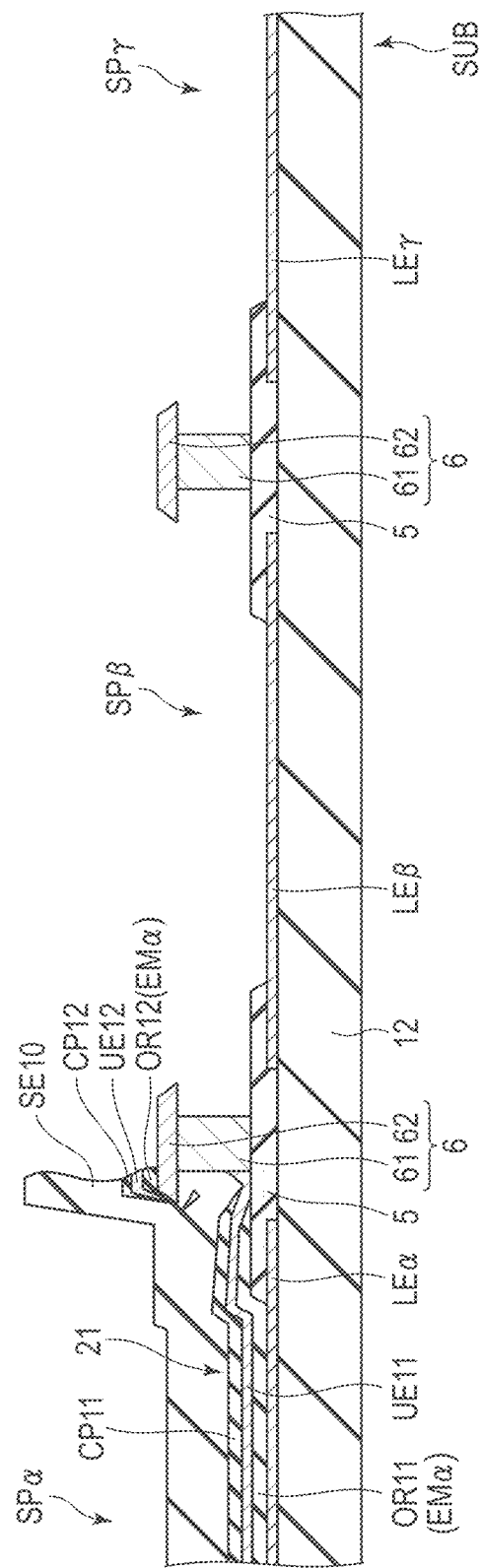
FIG. 17 is a diagram for explaining step ST24. .

Subsequently, in step ST24, as shown in FIG. 17, the first resist 41 is removed. Thus, the sealing layer SE10 of subpixel SPα is exposed. Through these steps ST21 to ST24, the display element 21 is formed in subpixel SPα. The display element 21 consists of the lower electrode LEα, the organic layer OR11 including the light emitting layer EMα, the upper electrode UE11 and the cap layer CP11. The display element 21 is covered with the sealing layer SE10.

A stacked layer body of the organic layer OR12 including the light emitting layer EMα, the upper electrode UE12 and the cap layer CP12 is formed on the partition 6 between subpixel SPα and subpixel SPβ. This stacked layer body is covered with the sealing layer SE10. Of the partition 6, the portion on the subpixel SPα side is covered with the sealing layer SE10.

The subpixel SPα of the above example is one of the subpixels SP1, SP2 and SP3 shown in FIG. 2. For example, when subpixel SPα corresponds to subpixel SP1, the following relationships are applied. The lower electrode LEα corresponds to the lower electrode LE1. The organic layer OR11 corresponds to the first portion OR1a of the organic layer OR1. The organic layer OR12 corresponds to the second portion OR1b of the organic layer OR1. The light emitting layer EMα corresponds to the light emitting layer EM1. The upper electrode UE11 corresponds to the first portion UE1a of the upper electrode UE1. The upper electrode UE12 corresponds to the second portion UE1b of the upper electrode UE1. The cap layer CP11 corresponds to the first portion CP1a of the cap layer CP1. The cap layer CP12 corresponds to the second portion CP1b of the cap layer CP1. The sealing layer SE10 corresponds to the sealing layer SE1.

As explained above, the present embodiment can provide a display device which can prevent the reduction in reliability and have an improved manufacturing yield, and a manufacturing method of such a display device.

All of the display devices and the manufacturing methods of the display devices that can be implemented by a person of ordinary skill in the art through arbitrary design changes to the display device and the manufacturing method of the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
   a substrate;
   a lower electrode overlapping the substrate in a plan view;
   a rib comprising an aperture overlapping the lower electrode;
   a first partition comprising
      a first lower portion provided on the rib, the first lower portion being conductive, being in direct contact with the rib, and not being in direct contact with the lower electrode, and
      a first upper portion provided on the first lower portion, the first upper portion being in direct contact with the first lower portion and extending beyond a side surface of the first lower portion;
   a second partition comprising
      a second lower portion provided on the rib, the second lower portion being conductive, being in direct contact with the rib, and not being in direct contact with the lower electrode, and a second upper portion provided on the second lower portion, the second upper portion being in direct contact with the second lower portion and extending beyond a side surface of the second lower portion, the second partition facing the first partition across the aperture in a first direction;

an organic layer provided on the lower electrode in the aperture and including
- a light emitting layer,
- a first end portion located on the rib, the first end portion being in direct contact with the rib and located between the first lower portion of the first partition and the aperture in the first direction, and
- a second end portion located on the rib, the second end portion being in direct contact with the rib and located between the second lower portion of the second partition and the aperture in the first direction;

an upper electrode which is provided on the organic layer, the upper electrode is in direct contact with the side surface of the second lower portion of the second partition, and the upper electrode is not in contact with the side surface of the first lower portion of the first partition;

a cap layer provided on the upper electrode and in direct contact with the upper electrode; and a sealing layer provided on the cap layer and in direct contact with the cap layer, wherein the upper electrode includes a third end portion located on the rib, the third end portion being in direct contact with the rib and located between the side surface of the first lower portion of the first partition and the first end portion of the organic layer in the first direction, the cap layer includes a fifth end portion located above the rib, the fifth end portion being not in direct contact with the rib, being in direct contact with the upper electrode and located between the third end portion of the upper electrode and the first end portion of the organic layer in the first direction, the sealing layer is in direct contact with and covers the third end portion of the upper electrode, the sealing layer is in direct contact with and covers the fifth end portion of the cap layer, the upper electrode includes a fourth end portion located on the rib, the fourth end portion being in direct contact with the side surface of the second lower portion of the second partition, the cap layer includes a sixth end portion located above the rib, the sixth end portion being not in direct contact with the rib, being in direct contact with the upper electrode and located between the fourth end portion of the upper electrode and the second end portion of the organic layer in the first direction, the sealing layer is in direct contact with and covers the fourth end portion of the upper electrode, and the sealing layer is in direct contact with the upper electrode between the sixth end portion of the cap layer and the side surface of the second lower portion of the second partition in the first direction.

2. The display device according to claim 1, wherein a second thickness of the upper electrode in a second region directly above the second end portion of the organic layer is greater than a first thickness of the upper electrode in a first region directly above the first end portion of the organic layer.

3. The display device according to claim 1, wherein the sealing layer is in direct contact with the rib between the side surface of the first lower portion of the first partition and the third end portion of the upper electrode in the first direction.

4. The display device according to claim 3, wherein the sealing layer is not in direct contact with the rib between the side surface of the second lower portion of the second partition and the aperture.

5. The display device according to claim 1, wherein the organic layer is not in direct contact with the first lower portion of the first partition, and the organic layer is not in direct contact with the second lower portion of the second partition.

6. The display device according to claim 1, wherein the cap layer is not in direct contact with the first lower portion of the first partition, and the cap layer is not in direct contact with the second lower portion of the second partition.

7. The display device according to claim 1, wherein the fifth end portion of the cap layer overlaps the first upper portion of the first partition in the plan view, and the sixth end portion of the cap layer overlaps the second upper portion of the second partition in the plan view.

8. The display device according to claim 1, wherein the sealing layer is in direct contact with the side surface of the first lower portion of the first partition, and the organic layer is in direct contact with the side surface of the second lower portion of the second partition.

* * * * *